(12) United States Patent
Schön

(10) Patent No.: US 12,084,767 B2
(45) Date of Patent: Sep. 10, 2024

(54) GAS-INLET ELEMENT FOR A CVD REACTOR

(71) Applicant: AIXTRON SE, Herzogenrath (DE)

(72) Inventor: Oliver Schön, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 326 days.

(21) Appl. No.: 17/626,113

(22) PCT Filed: Jul. 10, 2020

(86) PCT No.: PCT/EP2020/069473
§ 371 (c)(1),
(2) Date: Jan. 10, 2022

(87) PCT Pub. No.: WO2021/009019
PCT Pub. Date: Jan. 21, 2021

(65) Prior Publication Data
US 2022/0259737 A1    Aug. 18, 2022

(30) Foreign Application Priority Data

Jul. 12, 2019    (DE) .................... 10 2019 119 019.3

(51) Int. Cl.
*C23C 16/455*    (2006.01)
*C30B 25/14*    (2006.01)

(52) U.S. Cl.
CPC ........ *C23C 16/45565* (2013.01); *C30B 25/14* (2013.01)

(58) Field of Classification Search
None
See application file for complete search history.

(56) References Cited

U.S. PATENT DOCUMENTS

| 11,081,322 B2 * | 8/2021 | Noro ..................... C23C 16/505 |
| 2007/0166459 A1 * | 7/2007 | Chang ............... C23C 16/45574 |
| | | 427/248.1 |

(Continued)

FOREIGN PATENT DOCUMENTS

| DE | 10 2009 043 840 A1 | 3/2011 |
| EP |           1842938 A2 | 10/2007 |
| WO |      2019/199620 A1 | 10/2019 |

OTHER PUBLICATIONS

International Search Report mailed Oct. 20, 2020, from ISA/European Patent Office, for International Patent Application No. PCT/EP2020/069473 (filed Jul. 10, 2020), 11 pgs.

(Continued)

*Primary Examiner* — Sylvia MacArthur
(74) *Attorney, Agent, or Firm* — Ascenda Law Group, PC

(57) ABSTRACT

A gas outlet surface of a gas inlet element for a CVD reactor or a gas outlet surface of a shielding plate for a gas inlet element has a multiplicity of gas outlet openings arranged around a center of the gas outlet surface. The central points of the gas outlet openings lie at the corner points of polygonal, identically formed cells, each having a geometrical central point. The position and the length of the edges of the cells are defined by intersecting reference lines, the reference lines being assigned to at least two families of lines, and the reference lines of a respective family extending linearly and parallel to one another over an entirety of the gas outlet surface. The center of the gas outlet surface is separated from one of the corner points by one-third±10 percent of the length of one of the edges.

15 Claims, 3 Drawing Sheets

(56) References Cited

U.S. PATENT DOCUMENTS

| | | |
|---|---|---|
| 2008/0092815 A1 | 4/2008 | Chen et al. |
| 2011/0011338 A1* | 1/2011 | Chuc ................. C23C 16/45565 |
| | | 118/715 |
| 2016/0340782 A1 | 11/2016 | Chandrasekharan et al. |
| 2017/0167024 A1 | 6/2017 | Wiltse et al. |
| 2022/0259737 A1* | 8/2022 | Schön ............... C23C 16/45565 |

OTHER PUBLICATIONS

Written Opinion mailed Oct. 20, 2020, from ISA/European Patent Office, for International Patent Application No. PCT/EP2020/069473 (filed Jul. 10, 2020), 5 pgs.

Aixtron SE, "Gaseinlassorgan eines CVD-Reaktors", German Patent Application No. 10 2011 051 778.2, filed Jul. 12, 2011, 24 pgs.

Written Opinion mailed Oct. 20, 2020, from ISA/European Patent Office, for International Patent Application No. PCT/EP2020/069473 (filed Jul. 10, 2020), English translation, 8 pgs.

International Preliminary Report on Patentability issued Jan. 18, 2022, from The International Bureau of WIPO, for International Patent Application No. PCT/EP2020/069473 (filed Jul. 10, 2020), 18 pgs.

\* cited by examiner

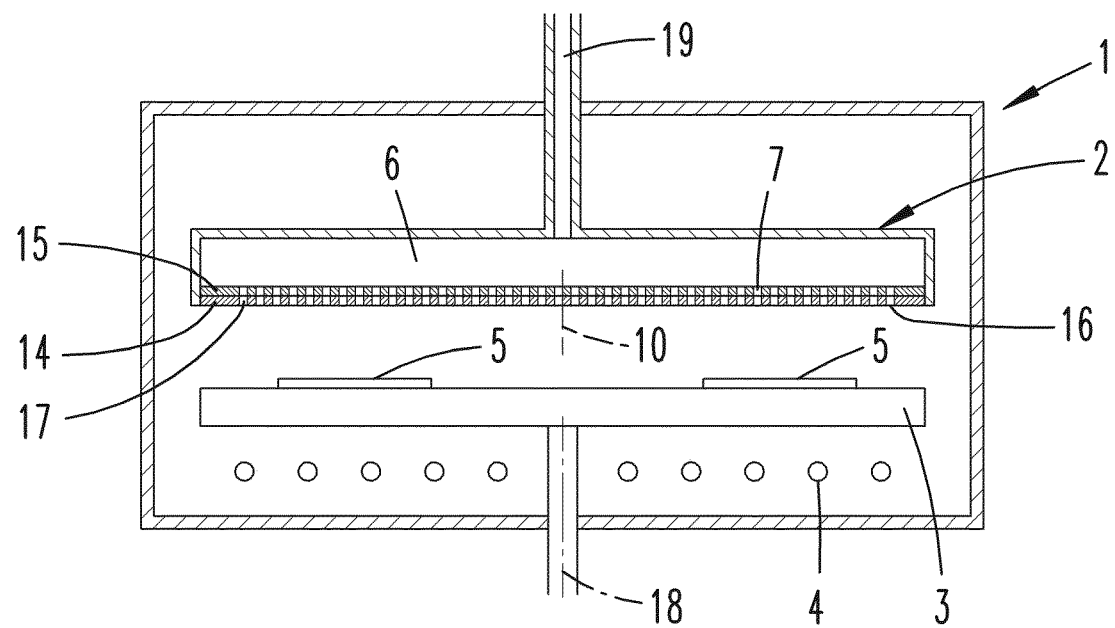

GAS-INLET ELEMENT FOR A CVD REACTOR

RELATED APPLICATIONS

This application is a National Stage under 35 USC 371 of and claims priority to International Application No. PCT/EP2020/069473, filed 10 Jul. 2020, which claims the priority benefit of DE Application No. 10 2019 119 019.3, filed 12 Jul. 2019.

FIELD OF THE INVENTION

The invention pertains to a gas outlet surface of a gas inlet element for a CVD reactor or a shielding plate for a gas inlet element, which has a plurality of gas outlet openings arranged around a center, wherein the central points of the gas outlet openings lie on the corner points of polygonal, identically designed cells that have a geometric central point, wherein the edges of the cells are defined by intersecting reference lines, wherein the reference lines are assigned to at least two families of lines, and wherein the reference lines of a respective family of lines extend linearly and parallel to one another over the entire gas outlet surface.

The invention furthermore pertains to a gas inlet element that has such a gas outlet surface, to a shielding plate that is fastened on a gas outlet surface of a gas inlet element and to a CVD reactor with such a gas inlet element or such a shielding plate, respectively.

BACKGROUND

A CVD reactor has a gas inlet element, by means of which process gases can be fed into a heatable process chamber. Substrates are arranged in the process chamber and can be thermally treated in the CVD reactor, e.g. by depositing a layer on the substrate surface.

Gas inlet elements of this type are described in DE 10 2011 051 778 A1, EP 1 842 938 A2, DE 10 2009 043 840 A1 and US 2017/0167024 A1. DE 10 2011 051 778 A1 describes a gas inlet element that is designed in the form of a showerhead. The gas outlet openings have a hexagonal arrangement. The central points of the gas outlet openings lie on the corner points of equilateral triangles. The edges of the cells formed by the equilateral triangles are respectively formed by reference lines. The reference lines are formed by families of lines. Each family of lines comprises a plurality of reference lines that are equidistantly spaced apart and extend parallel to one another. The reference lines of the different families of lines are inclined relative to one another by 120°.

US 2017/0167024 describes a showerhead, in which the central points of the gas outlet openings lie on intersecting points of reference lines that are formed by Fermat's spirals.

WO 2019/199620 A1 describes a gas inlet element with an underside that is directed toward the substrate, wherein said underside has a plurality of inlet openings and outlet openings that are regularly distributed over the area.

SUMMARY OF THE INVENTION

Such a gas inlet element is used in CVD reactors, in which a relative rotation takes place between the respective gas inlet element or gas outlet surface and the susceptor. The susceptor is rotated relative to the stationary gas inlet element about a rotary spindle. This rotary spindle defines a center. Gas inlet elements may have a circular gas outlet surface. Such a circular gas outlet surface has a center. A circular gas outlet plate forming a gas outlet surface has a center. A circular-cylindrical gas inlet element has an end face that forms a gas outlet surface and has a center. The gas outlet openings have a defined position relative to such a center.

During a relative rotation, each gas outlet opening in a manner of speaking passes over an annular area of the susceptor, the central point of which is the center, i.e. the rotary spindle. If the center lies in the central point of a central gas outlet opening, an annular area, over which no gas outlet opening moves during the rotation, remains around this circular area. A similar situation arises when the center coincides with the central point of a cell, the corner points of which are formed by the central points of adjacent gas outlet openings.

Analogously, not all circular arc lines placed around the center extend through at least one gas outlet opening in such an arrangement. The central region of the gas outlet surface therefore has, for example, circular "gaps" that can lead to an insufficient supply of the process chamber with process gas.

The invention is based on the objective of improving the infeed of process gases, particularly in the central region of the process chamber, with respect to the process technology.

This objective is attained with the invention specified in the claims, wherein the dependent claims not only represent advantageous enhancements of the invention claimed in the coordinate claims, but rather also independent solutions.

According to the invention, the position of at least one central gas outlet opening is defined in relation to the center of a rotationally symmetrical body, e.g. a gas outlet surface, a gas outlet plate, a shielding plate, a gas inlet element or the like. It is initially and essentially proposed that the center, e.g. the central point of a circular gas outlet surface or the rotary spindle of a susceptor, lies in an arrangement of gas outlet openings on the corners of identically designed cells offset to the corner points and also offset to the central point of the area of the cell. In an alternative, which nevertheless can also be realized in combination with the above-described technical solution, the invention proposes that one of the preferably identical outlet openings forms a central outlet opening, wherein the center is arranged in the cross-sectional area of the gas outlet opening, namely offset relative to the central point of the preferably circular gas outlet opening. In this case, the center particularly may lie approximately on the edge of the gas outlet opening such that the central gas outlet opening in a manner of speaking rotates about the center during the relative rotation. Furthermore, the distance of the central gas outlet opening from a closest gas outlet opening may be smaller than twice the diameter of a gas outlet opening. It is advantageous if the distance between the edges of two adjacent gas outlet openings is smaller than the diameter of the gas outlet opening, particularly the central gas outlet opening. No annular "gaps" of the initially described type are formed in an inventive arrangement of the gas outlet openings. In fact, the gas outlet openings are arranged on the gas outlet surface in such a way that any arbitrary circular arc line drawn around the center intersects at least one gas outlet opening, particularly in the central region of the gas outlet surface. The reference lines of the families of lines, the intersecting points of which define the position of the central points of the gas outlet openings, may extend linearly and parallel to one another over the entire gas outlet surface such that a plurality of regular polygons is formed. Triangular or quadrangular polygons, preferably regular polygons, may be formed. The cells, which thereby are defined by the corner points of the reference lines and the edges of which are sections of the reference lines, have geometric central points. The central points may be the centers of area of the cells. The cells form a central cell. The center is offset relative to each of the corner points and relative to the central point of the area. The cells may have edges of equal length. The center may be spaced apart from a corner point by approximately ⅓±10% of the length of the edge. The center may be spaced apart from the corner point in a direction of a bisector of two lines that intersect in the corner point. Furthermore, the length of an edge may amount to approximately 7.07 mm±10%. The gas outlet openings may have a diameter of 4 mm±10%. The center may be spaced apart from a corner point by 2 mm±10%. The inventive arrangement of the gas outlet openings on a gas outlet surface may be realized on a gas outlet plate of a gas inlet element. The gas outlet plate delimits a volume, through which a coolant can flow, through which a coolant can flow and/or into which a process gas that can enter a process chamber through the gas outlet openings is fed. However, it is also proposed that the arrangement of the gas outlet openings is realized on a shielding plate. Such a shielding plate is fastened on the gas inlet element adjacent to the gas outlet plate. The gas outlet openings of the shielding plate are aligned with the gas outlet openings of the gas outlet plate of the gas inlet element. The gas outlet plate may consist of metal, special steel, aluminum or the like. The shielding plate may consist of a ceramic material, coated graphite or also of metal. The shielding plate may consist of a porous material. It may have a rough surface.

The invention furthermore pertains to a CVD reactor with a gas-proof and pressure-proof housing consisting of metal. A gas inlet element, which has the above-described properties and particularly is realized in the form of a showerhead, is located within the housing. The gas outlet surface extends in a plane of rotation of a rotary spindle, by means of which a susceptor is rotationally driven. An upper side of the susceptor forms a bottom area of a process chamber. The gas outlet surface of the gas inlet element forms the upper side of a process chamber. The rotary spindle of the susceptor defines the center of the gas inlet element, which as described above is arranged offset relative to the central point of a central gas outlet opening, as well as offset relative to the central point of a central cell of an arrangement of gas outlet openings. A shielding plate with the above-described properties may be arranged between the gas outlet plate of the gas inlet element and the susceptor. The shielding plate may abut on and contact the underside of the gas outlet plate facing the susceptor. However, the shielding plate may also be spaced apart from the underside of the gas outlet plate. A tempering device may be provided. The susceptor can be tempered means of the tempering device. For example, the tempering device may be a heating device. The gas inlet element may likewise have a tempering device in order to cool or heat the gas outlet surface.

The gas outlet plate and/or the shielding plate may consist of graphite or of graphite that is coated with SiC or TaC. However, the surfaces of the gas inlet element preferably are stainless steel surfaces. The walls and the gas outlet plate of the gas inlet element therefore may consist of stainless steel. The gas outlet openings of the shielding plate may be aligned with the gas outlet openings of the gas outlet plate of the gas inlet element. However, they may also be arranged offset relative thereto.

The invention furthermore pertains to a method for operating an above-described CVD reactor, in which the susceptor is rotationally driven about a rotary spindle, wherein said rotary spindle defines a center that lies offset relative to the corner points, as well as offset relative to the central point of the area of a central cell.

BRIEF DESCRIPTION OF THE DRAWINGS

The invention is described in greater detail below with reference to exemplary embodiments. In the drawings:

FIG. 5 shows a second exemplary embodiment in the form of a representation according to FIG. 1.

DETAILED DESCRIPTION

Figure 1:
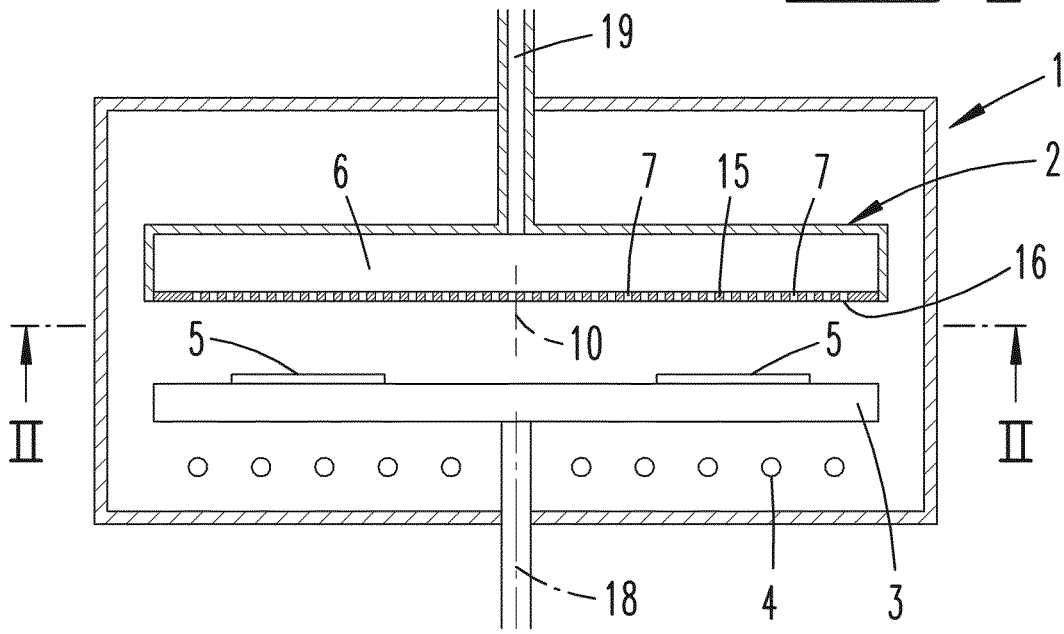
FIG. 1 schematically shows a section through a CVD reactor according to a first exemplary embodiment.

FIGS. 1 and 5 schematically show the structure of a CVD reactor that preferably is realized in the form of a MOCVD reactor, in which a coating process is carried out, wherein III-V substrates or IV substrates such as silicon substrates or the like are coated with III-V layers in said coating process. The layers may consist, for example, of gallium arsenide, gallium phosphide or gallium nitride layers. To this end, a process gas, which particularly is a gas mixture, is fed into a gas distribution volume 6 of a gas inlet element 2 in the form of a showerhead through a gas supply line 19. The gas inlet element may have multiple gas distribution volumes 6 that are separated from one another and respectively have assigned gas outlet openings 7. A gas of the process gas such as a hydride of an element of the V main group or an organo-metallic compound of an element of the III main group is fed into each of these gas distribution volumes 6.

A susceptor 3 formed by a coated graphite plate is located underneath the gas inlet element 6. A rotary spindle 18 is provided, about which the susceptor 3 can be rotationally driven in a plane of rotation. A heating device 4 is located underneath the susceptor 3 in order to heat the susceptor 3 to a process temperature. The CVD reactor 1 can be evacuated by means of a pump that is connected to a not-shown gas outlet.

Figure 2:
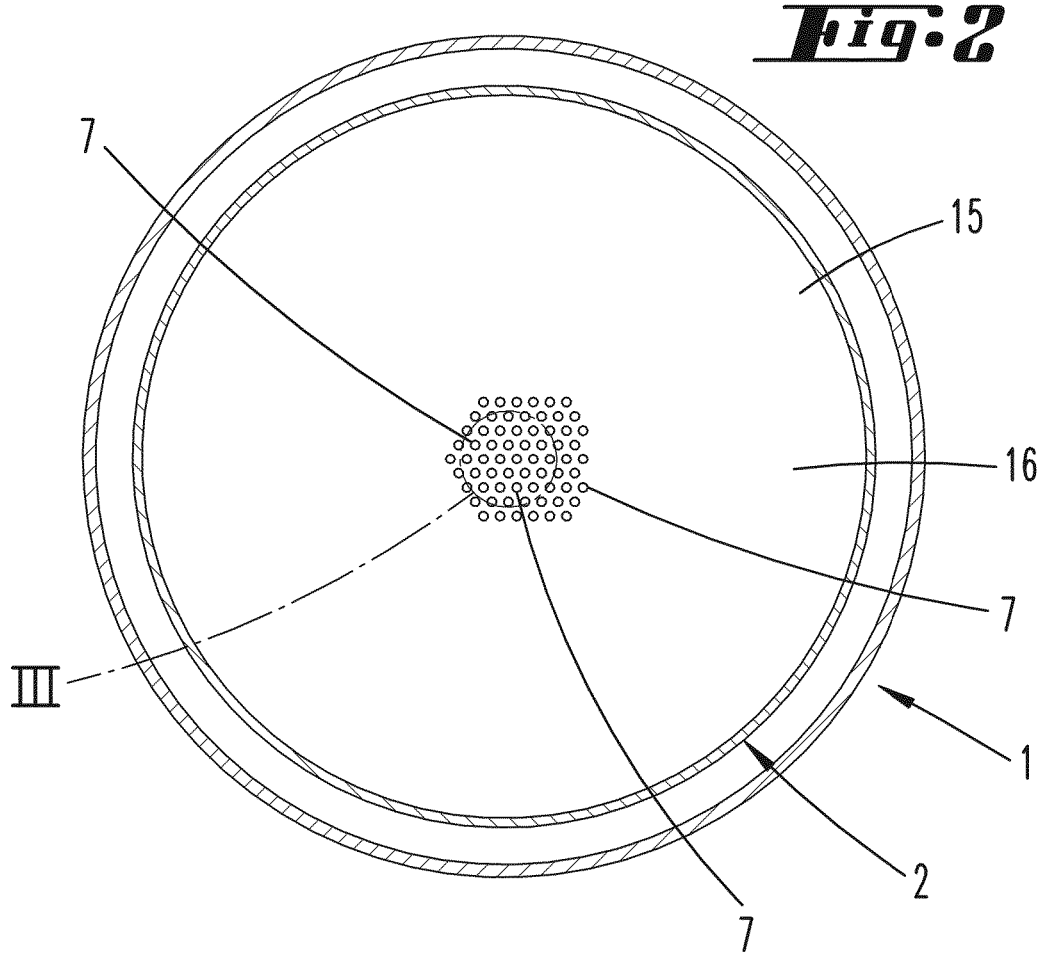
FIG. 2 shows a bottom view of a gas outlet surface of a gas inlet element along the line II-II in FIG. 1.
Figure 3:
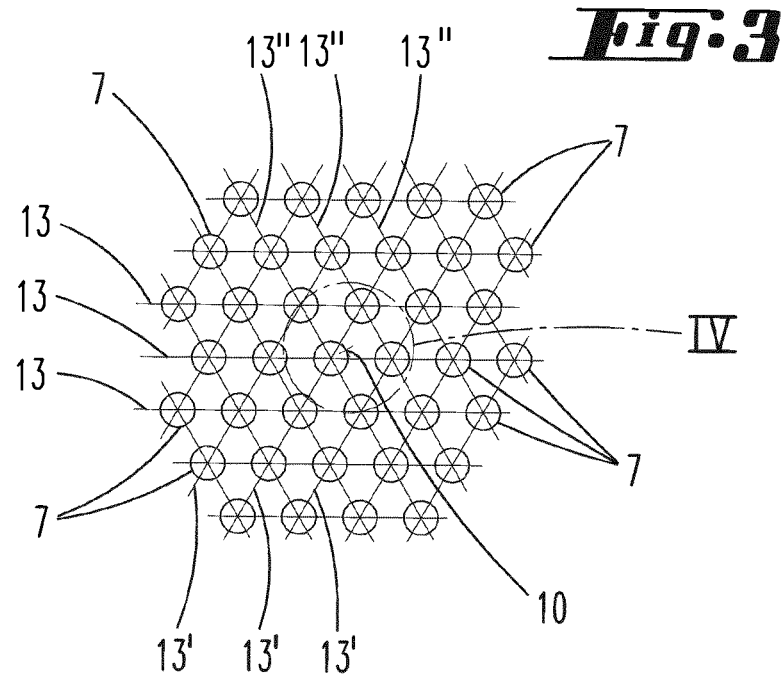
FIG. 3 shows an enlarged representation of the detail III in FIG. 2.

A gas outlet surface 16 is formed by the underside of a gas outlet plate 15 containing the gas outlet openings 7, wherein said underside faces the susceptor 3. This is illustrated in FIG. 2. According to the enlarged detail of the gas outlet surface 16 illustrated in FIG. 3, the gas outlet openings 7 respectively have a circular outline. In the exemplary embodiment, all gas outlet openings 7 have the same circular outline and a diameter D of approximately mm. The edges of two gas outlet openings 7 that lie closest to one another are spaced apart by less than the diameter of a gas outlet opening 7.

The gas outlet openings 7 are uniformly distributed over the gas outlet surface 16 in the form of a hexagonal arrangement. In this disclosure, the arrangement of the gas outlet openings 7 is described by means of reference lines 13, 13', 13". There are three families of reference lines 13, 13', 13", wherein the reference lines 13, 13', 13" respectively extend parallel to one another and are spaced apart equidistantly. The reference lines of the different families of lines are inclined relative to one another by an angle of 120°. A gas outlet opening 7 is arranged at all intersecting points of the reference lines 13, 13', 13". The reference lines 13, 13', 13" therefore define a plurality of identically designed cells 8, which respectively have the shape of an equilateral triangle. In not-shown exemplary embodiments, two families of lines may have reference lines that are offset relative to one another by 90° such that the cells 8 have the shape of rectangles or squares.

Figure 4:
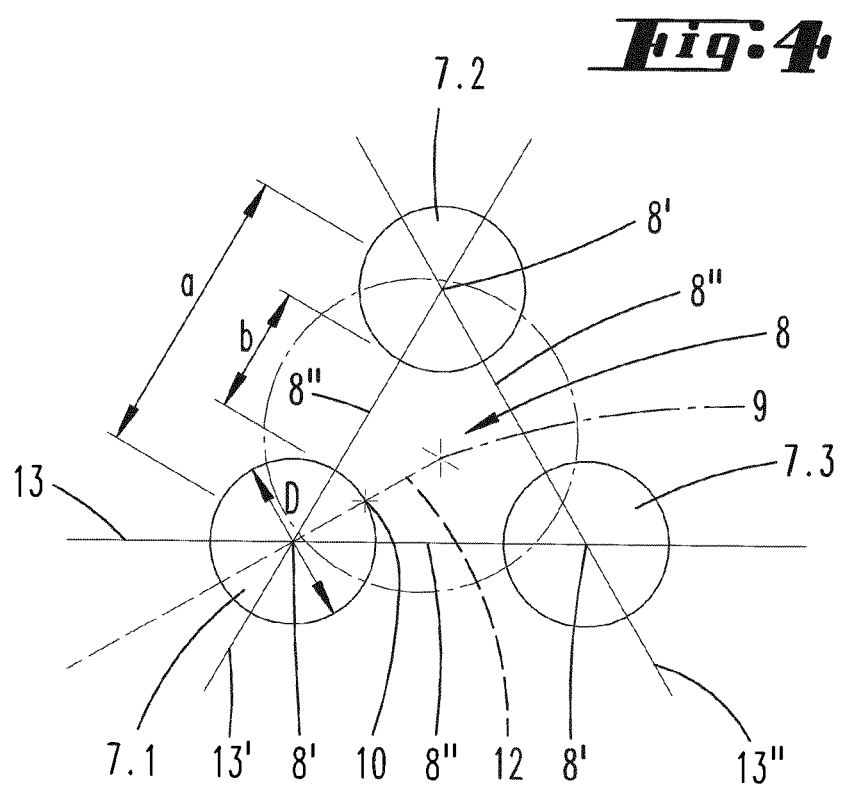
FIG. 4 shows an enlarged representation of the detail IV in FIG. 3.

In the exemplary embodiment, the corner points 8' of the cells 8 are spaced apart from one another by a distance a of 7.07 mm. The gas outlet openings 7 have a central point that coincides with the corner points 8' and a diameter D of approximately 4 mm. FIG. 4 shows a center that may be the geometric central point of the gas outlet surface 16, wherein said geometric central point coincides with the center of the rotary spindle 18 when the reactor is in use. According to the invention, the center 10 neither lies in a geometric central point 9 of the cell 8 nor in a corner point 8' of the cell 8. The center 10 is offset relative to the corner point 8' by approximately 2 mm in the exemplary embodiment. In this case, the center 10 lies on the edge of a central gas outlet opening 7.1. It may be located on a bisector 12, i.e. on a line that extends through the corner point 8' and the central point 9. The center 10 may lie between the central point 9 of the cell 8 and the central point of the central gas outlet opening 7.1. However, the center 10, which may also be the geometric central point of a gas outlet plate 15 or the center of an end face of a gas inlet element 2, may also be arranged at any other location within the cross-sectional area of the central gas outlet opening 7.1, but not in the central point of the cross-sectional area.

In this arrangement, the two gas outlet openings 7.2 and 7.3 are equidistantly spaced apart from the central gas outlet opening 7.1. The distance b of the two edges of the central gas outlet opening 7.1 from the respective adjacent gas outlet opening 7.2 or 7.3 is smaller than the diameter D such that the area of the gas outlet opening 7 passes over a circular area, which is slightly larger than the annular clearance area between the center 10 and the edge of the adjacent gas outlet openings 7.2, 7.3, during a relative rotation about the center 10.

Consequently, there are no annular areas, over which at least one gas outlet opening 7 does not pass during a rotation of the susceptor 3 relative to the gas outlet surface 16.

The exemplary embodiment illustrated in FIG. 5 essentially can only be distinguished from the exemplary embodiment illustrated in FIG. 1 in that a shielding plate 14 is arranged on the area of the gas outlet plate 15 facing the process chamber, wherein the gas outlet openings 17 of said shielding plate are aligned with the gas outlet openings 7. The arrangement of the gas outlet openings 17 corresponds to the arrangement illustrated in FIGS. 2, 3 and 4.

In this case, the shielding plate 14 is arranged in such a way that its gas outlet openings 17 are aligned with the gas outlet openings 7 of the gas outlet plate 15. However, the gas outlet openings 17 may also be arranged offset relative to the gas outlet openings 7 in a not-shown exemplary embodiment, in which the shielding plate 14 is spaced apart from the gas outlet plate 15. In this case, it is nevertheless proposed that the central one of the gas outlet openings 17 of the shielding plate 14 has the above-described position.

The preceding explanations serve for elucidating all inventions that are included in this application and respectively enhance the prior art independently with at least the following combinations of characteristics, wherein two, multiple or all of these combinations of characteristics may also be combined with one another, namely:

A gas outlet surface 16 of a gas inlet element 2 for a CVD reactor 1 or a shielding plate 14 for a gas inlet element 2, which is characterized in that the center 10 is spaced apart from the corner point (8') by one-third±10 percent of the length of the edge.

A gas outlet surface 16, which is characterized in that the cells 8 have edges 8' of equal length.

A gas outlet surface 16, which is characterized in that the center 10 lies in the area of a cell 8 such that it is offset relative to the central point 9.

A gas outlet surface 16, which is characterized in that the cells 8 are regular polygons and/or triangles or quadrangles.

A gas outlet surface 16, which is characterized in that the length of the edge 8" amounts to 7.07 mm±10 percent.

A gas inlet element, which is characterized by a gas outlet surface 16 according to one of claims 1 to 4.

A gas inlet element, which is characterized in that the gas outlet surface 16 is formed by a shielding plate 14 that is arranged on the gas outlet plate 15 with an identical arrangement of gas outlet openings 7.

A CVD reactor 1 with a housing, which is characterized by a gas outlet surface according to one of the preceding claims.

A CVD reactor, which is characterized in that the gas outlet surface 16 is formed by a shielding plate 14 that is arranged on the gas outlet plate 15 with an identical arrangement of gas outlet openings 7.

A gas inlet element 2 for a CVD reactor with a gas outlet surface, which characterized by a shielding plate 14 that is arranged on the area of the gas outlet plate 15 facing the process chamber, wherein the gas outlet openings 17 of said shielding plate are aligned with the gas outlet openings 7 of the gas inlet element 2.

A gas outlet surface of a gas inlet element 2 for a CVD reactor 1 or a shielding plate 14 for a gas inlet element 2, which is characterized in that the first distance corresponds to no more than the radius of the gas outlet opening 7, 17 and a second distance of the central point 8' of the central gas outlet opening 7, 17 from the central point 8' of a gas outlet opening 7, 17 lying closest to the central gas outlet opening 7, 17 is smaller than the sum of the diameters D of both gas outlet openings 7, 17 and/or in that the center 10 of the gas outlet surface 16 lies in the area of one of the cells 8 such that it is offset relative to the corner points 8', as well as offset relative to the central point 9, and/or in that the length of the edge 8" is smaller than twice the diameter of the gas outlet openings 7, 17 and/or in that the gas outlet openings 7, 17 have a diameter of 4 mm±10 percent and/or in that the center 10 lies on the edge of a gas outlet opening 7, 17 and/or in that the center 10 lies offset relative to the corner point 8' by 2 mm±10 percent.

A gas outlet surface, which is characterized in that the center 10 is spaced apart from a corner point 8' in a direction of a bisector 12 of two reference lines 13, 13', 13" that intersect in the corner point 8' and/or in that the length of the edge 8" amounts to 7.07 mm±10% and/or in that the identically designed gas outlet openings 7, 17 have a circular outline and/or in that the length of the edge 8" is smaller than twice the diameter of the gas outlet openings 7, 17 and/or in that the gas outlet openings 7, 17 have a diameter of 4 mm±10% and/or in that the center 10 lies on the edge of a gas outlet opening 7, 17 and/or in that the center 10 lies offset relative to the corner point 8' by 2 mm±10%.

A method for operating a CVD reactor 1, which is characterized in that the susceptor 3 is rotated relative to the stationary gas inlet element 2 about a rotary spindle 18, wherein the center 10 of the gas outlet surface 16 lies in the rotary spindle 18 and in the area of one of the cells such that it is offset relative to the corner points 8', as well as offset relative to the central point 9.

However, the diameter of the gas outlet openings 7, 17 may also be smaller than 2 mm and amount, for example, to 1.65 mm. In such a constellation, the distance between two adjacent gas outlet openings may amount to 7.07 mm. The central point of the gas outlet opening lying closest to the center of the gas outlet surface may be spaced apart from the center by 2.3 mm.

All disclosed characteristics are essential to the invention (individually, but also in combination with one another). The disclosure of the associated/attached priority documents (copy of the priority application) is hereby fully incorporated into the disclosure content of this application, namely also for the purpose of integrating characteristics of these documents into claims of the present application. The characteristics of the dependent claims also characterize independent inventive enhancements of the prior art without the characteristics of a claim to which they refer, particularly for submitting divisional applications on the basis of these claims. The invention specified in each claim may additionally comprise one or more of the characteristics that were disclosed in the preceding description and, in particular, are identified by reference symbols and/or included in the list of reference symbols. The invention also concerns design variations, in which individual characteristics cited in the preceding description are not realized, particularly as far as they are obviously dispensable for the respective intended use or can be replaced with other, identically acting technical means.

LIST OF REFERENCE SYMBOLS

1 CVD reactor
2 Gas inlet element
3 Susceptor
4 Tempering device
5 Substrate
6 Gas distribution volume
7 Gas outlet opening
7.1 Gas outlet opening
7.2 Gas outlet opening
7.3 Gas outlet opening
8 Cell
8' Corner point
8" Edge
9 Central point
10 Center
12 Bisector
13 Reference line
13' Reference line
13" Reference line
14 Shielding plate
15 Gas outlet plate
16 Gas outlet surface
17 Gas outlet opening
18 Rotary spindle
19 Gas supply line
a Distance
b Distance

What is claimed is:

1. A gas outlet surface (16) of a gas inlet element (2) for a chemical vapor deposition (CVD) reactor (1) or of a shielding plate (14) for the gas inlet element (2), the gas outlet surface (16) comprising:
   a plurality of gas outlet openings (7, 17) arranged around a geometric center (10) of the gas outlet surface (16),
   wherein respective central points of the gas outlet openings (7, 17) lie on respective corner points (8') of polygonal, identically shaped cells (8) that each have a geometric central point (9),
   wherein a position and a length of respective edges (8") of the cells (8) are defined by intersecting reference lines (13, 13', 13"),
   wherein the reference lines (13, 13', 13") are assigned to at least two families of lines,
   wherein the reference lines of a respective family of lines extend linearly and parallel to one another over an entirety of the gas outlet surface (16),
   wherein the geometric center (10) of the gas outlet surface (16) is spaced apart from a first one of the corner points (8') by one-third±10 percent of the length of a first one of the edges (8"), and
   wherein a central point of a central one of the gas distribution openings (7.1) is offset from the geometric center (10) of the gas outlet surface (16).

2. The gas outlet surface (16) of claim 1, wherein the respective lengths of the edges (8") are equal to one another.

3. The gas outlet surface (16) of claim 1, wherein the geometric center (10) of the gas outlet surface (16) lies in an area of a first one of the cells (8) such that the geometric center (10) of the gas outlet surface (16) is spaced apart from the geometric central point (9) of the first cell (8).

4. The gas outlet surface (16) of claim 1, wherein the cells (8) are regular polygons.

5. The gas outlet surface (16) of claim 1, wherein the length of the first edge (8") equals 7.07 mm±10 percent.

6. A gas inlet element (2), comprising:
   a gas distribution volume (6); and
   a gas outlet plate (15) with the gas outlet surface (16) of claim 1.

7. The gas inlet element (2) of claim 6, wherein the gas outlet surface (16) is formed by a shielding plate (14) that is arranged on the gas outlet plate (15) having an arrangement of gas outlet openings (7) identical to that of the gas outlet surface (16).

8. A chemical vapor deposition (CVD) reactor (1) comprising:
   a housing;
   a gas inlet element (2) arranged in the housing, the gas inlet element (2) comprising the gas outlet surface (16) of claim 1; and
   a susceptor (3) for supporting substrates (5), wherein said susceptor (3) is spaced apart from the gas outlet surface (16) of the gas inlet element (2) and is rotationally driven about a rotary spindle (18), wherein a rotary axis of the susceptor (3) intersects the geometric center (10) of the gas outlet surface (16).

9. The CVD reactor of claim 8, wherein the gas outlet surface (16) is formed by a shielding plate (14) that is arranged on a gas outlet plate (15) of the gas inlet element (2), the gas outlet plate (15) having an arrangement of gas outlet openings (7) identical to that of the gas outlet surface (16).

10. A method for operating the CVD reactor (1) of claim 8, the method comprising:
   rotating the susceptor (3) about the rotary spindle (18), wherein the gas inlet element (2) is stationary relative to the rotating susceptor (3), and
   wherein the geometric center (10) of the gas outlet surface (16) lies directly above the rotary spindle (18) and lies in a first one of the cells (8) such that the geometric center (10) of the gas outlet surface (16) is spaced apart from (i) the corner points (8') of the first cell (8), and (ii) the geometrical central point (9) of the first cell (8).

11. The gas outlet surface (16) of claim 1, wherein the geometric center (10) of the gas outlet surface (16) is spaced apart from the first corner point (8') in a direction of a bisector (12) of two of the reference lines (13, 13', 13") that intersect at the first corner point (8').

12. The gas outlet surface (16) of claim 1, wherein all of the outlet openings (7, 17) have circular outlines that are identical to one another.

13. The gas outlet surface (16) of claim 1, wherein the length of the first edge (8") is smaller than two times a diameter of one of the gas outlet openings (7, 17).

14. The gas outlet surface (16) of claim 1, wherein each of the gas outlet openings (7, 17) has a diameter of 4 mm±10%, and the geometric center (10) of the gas outlet surface (16) lies on an edge of one of the gas outlet openings (7, 17).

15. The gas outlet surface (16) of claim 1, wherein the geometric center (10) of the gas outlet surface (16) is spaced apart from the first corner point (8') by 2 mm±10%.

\* \* \* \* \*